US008214166B2

(12) United States Patent
Tanaka et al.

(10) Patent No.: US 8,214,166 B2
(45) Date of Patent: Jul. 3, 2012

(54) METHOD AND ITS SYSTEM FOR CALIBRATING MEASURED DATA BETWEEN DIFFERENT MEASURING TOOLS

(75) Inventors: Maki Tanaka, Mito (JP); Wataru Nagatomo, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 456 days.

(21) Appl. No.: 12/137,779

(22) Filed: Jun. 12, 2008

(65) Prior Publication Data
US 2008/0319696 A1 Dec. 25, 2008

(30) Foreign Application Priority Data
Jun. 15, 2007 (JP) .................. 2007-158621

(51) Int. Cl.
*G01P 21/00* (2006.01)
(52) U.S. Cl. .................. 702/95; 702/104; 438/14
(58) Field of Classification Search .................. 702/95, 702/104
See application file for complete search history.

(56) References Cited

U.S. PATENT DOCUMENTS
7,700,247 B2 * 4/2010 Ausschnitt ............... 430/30
2002/0165636 A1 * 11/2002 Hasan ..................... 700/121
2003/0174876 A1 * 9/2003 Eran et al. ............... 382/144
2003/0220756 A1 * 11/2003 Stengele .................. 702/94
2006/0061757 A1 * 3/2006 Yamamoto et al. ........ 356/124

FOREIGN PATENT DOCUMENTS
| JP | 2003-287508 | 10/2003 |
| JP | 2006-510912 | 3/2006 |
| JP | 2006-118867 | 5/2006 |
| WO | WO 2004/059247 A1 | 7/2004 |

* cited by examiner

*Primary Examiner* — Jonathan C Teixeira Moffat
(74) *Attorney, Agent, or Firm* — Antonelli, Terry, Stout & Kraus, LLP.

(57) ABSTRACT

A method, and a corresponding system, are provided for calibrating data of an object measured by different measuring tools, including measuring a Critical-Dimension (CD) and roughness of an object by using a CD-SEM tool, calculating a number of cross section measurement points required for calibration, by statistically processing the roughness of the object, measuring the cross section of the object by using a cross section measuring tool to obtain cross section data at the calculated number of cross section measurement points, calculating the average measurement of the cross section measurement height, and calculating a calibration correction value that is a function of a difference between the average CD measurement of the object and the average measurement of the cross section measurement height of the object.

21 Claims, 12 Drawing Sheets

2009 TRANSMISSION ELECTRON BEAM

STEP (1)
SPECIFYING HEIGHT TO BE MEASURED OBJECT
$ya = Hth/100 * (yt-ys) + ys$

FIG. 3B

STEP (2)
DETERMINING EDGE POSITION FROM WAVEFORM AT ya
$Sa = Th/100 * (Ss-St) + St$

FIG. 5A

------ CD-SEM SAMPLING
―――― CROSS SECTION MEASUREMENT SAMPLING

┆┄┆ CD-SEM SAMPLING

—— CROSS SECTION MEASUREMENT SAMPLING

METHOD AND ITS SYSTEM FOR CALIBRATING MEASURED DATA BETWEEN DIFFERENT MEASURING TOOLS

BACKGROUND OF THE INVENTION

The present invention relates to a method and its system for calibrating measured data between different measuring tools capable of performing a highly accurate calibration between different measuring tools by sampling in consideration of local dispersion in sample dimension such as line width roughness As a measuring instrument with a resolution of nanometer order, there has been known a Critical-Dimension Scanning Electron Microscopy (CD-SEM) tool. The CD-SEM tool is stable and has a high throughput. However, since it measures the dimensions of a pattern (CD) by using only top-down view of SEM image, it has a problem in that it is unclear where in the height direction of a pattern, that is, where in the cross section of an upper, a lower or a middle portion therebetween the CD-SEM tool measures.

On the other hand, as a measuring instrument capable of measuring cross section dimension, cross-section observation using a scanning transmission electronic microscope (STEM) tool, a transmission electronic microscope (TEM) tool, and a cross-section observation SEM tool, as well as cross-section observation using an atomic force microscope (AFM) tool have been known. The configuration of the STEM tool is described in, for example, JP-A 2003-287508. The configuration of the AFM tool is described in, for example, JP-A 2006-118867. The STEM tool, the cross-section observation SEM tool, the AFM tool and the TEM tool have the advantages that they can relatively accurately measure cross section dimension. The AFM tool, however, has a problem in that it requires a longer measuring time than the CD-SEM tool. For the STEM tool, the cross-section observation SEM tool and the TEM tool, require sample preparation such as FIB process for cross-sectional imaging/measurements, causing a problem in that a measuring cost becomes higher than that of the AFM tool.

A calibration method in which each dispersion of measurement of different measuring tools is taken in consideration is disclosed in JP-T 2006-510912.

The above CD-SEM tool is capable of measuring the dimensions at multiple positions, which are observed by a top-down SEM image. taking into account the pattern size variation in a high throughput. However, On the other hand, the STEM tool, the cross-section observation SEM tool, the AFM tool or and the TEM tool can relatively accurately measure the cross section shape (three-dimensional shape) of a measurement pattern than the CD-SEM tool, so that they can perform calibration with the dimension at a desired height, however, it is hard for them to measure too many points.

For this reason, at the time of calibration between the CD-SEM tool and the cross-section observation SEM tool or the AFM tool, there is a problem in that it is not clear that the measurement result of cross section shape measured with limited sampling capability with the STEM tool, the cross-section observation SEM tool, the AFM tool or and the TEM tool corresponds to which of the dimension measured with the CD-SEM.

SUMMARY OF THE INVENTION

The present invention has been made to solve the above problems and relates to a method and its system for calibrating measured data between different measuring tools capable of performing a highly accurate calibration between different measuring tools by sampling in consideration of roughness.

A method of calibrating measured data between different measuring tools according to the present invention includes the steps of: measuring the CD (Critical-Dimension) average and dispersion of an object to be measured by measuring multiple CD at different points of the object using a CD-SEM tool; calculating the number of cross section measurement points at required for calibration is measured using a cross section measuring tool by statistically calculating CD dispersion measured at the step of the CD-SEM measurement; measuring the cross section of the object to be measured using the cross section measuring tool to satisfy the number of the cross section measurement points calculated at the step of calculating the number of the cross section measurement points, thereby calculating the CD average dimension of the cross section measurement height specified in the obtained cross section measurement result; and calculating a calibration correction value being a difference between the CD average dimension of the object to be measured, the CD average dimension being measured at the step of the CD-SEM measurement and the CD average dimension of the cross section cross section measurement height of the object to be measured, the CD average dimension being calculated at the step of measuring the cross section.

The method of calibrating measured data between different measuring tools according to the present invention includes the steps of: calculating the number of the cross section measurement points at which the object to be measured and required for calibration is measured using a cross section measuring tool by statistically processing roughness of an object measured by a CD-SEM tool; sequentially measuring the object to be measured in units of lot produced using the CD-SEM tool to measure change in CD average dimension thereof; measuring the cross section of the object to be measured for each predetermined production period using the cross section measuring tool to satisfy the cross section measurement points calculated at the step of calculating the number of the cross section measurement points to calculate change in the CD average dimension of the cross section measurement height specified in the obtained cross section measurement result; and controlling a bias based on change in the CD average dimension of the object measured for each sequential lot at the step of the CD-SEM measurement and change in the CD average dimension of the cross section measurement height of the object to be measured for each predetermined period, the change in the CD average dimension of the cross section measurement height being calculated at the step of measuring the cross section.

In the present invention, the calibration correction value can be captured as error resulting from change in cross section shape of an object to be measured or change in measurement conditions of the CD-SEM tool.

According to the present invention, sampling in consideration of roughness enables high accurate calibration of different measuring tools and display of the calibration result.

These and other objects, features and advantage of the invention will be apparent from the following more particular description of preferred embodiments of the invention, as illustrated in the accompanying drawings.

DESCRIPTION OF THE PREFERRED EMBODIMENTS

The embodiment of a calibration method between different measuring tools and a system for the same is described with reference to the drawings.

Figure 1:
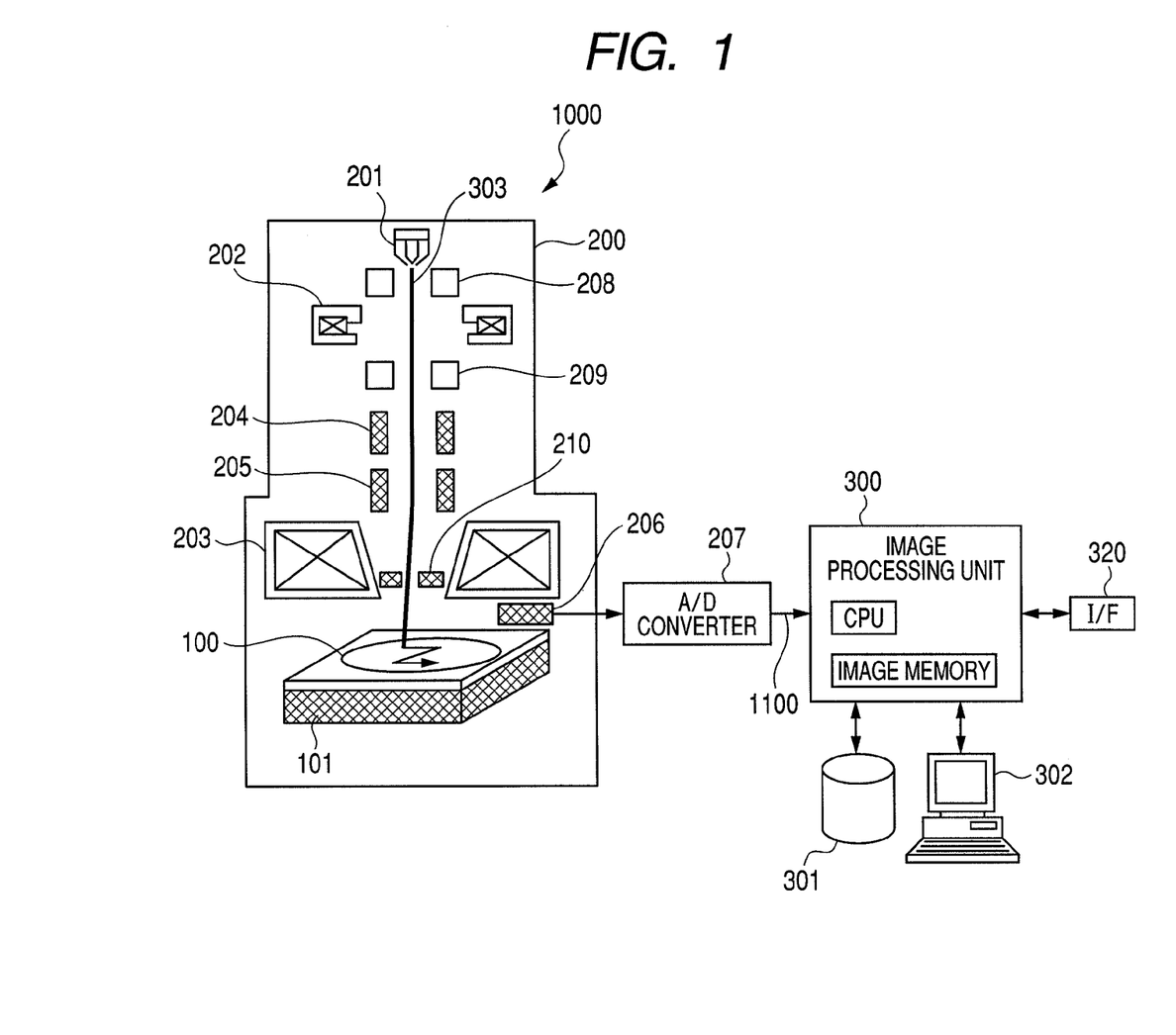
FIG. 1 is a schematic diagram illustrating one embodiment of a CD-SEM tool (critical dimension SEM tool)

The CD-SEM tool according to the present invention is described using FIG. 1. FIG. 1 is a block diagram illustrating the configuration of a critical dimension SEM tool (a CD-SEM tool) according to the present invention. In FIG. 1, an electronic optical system 200 forming the critical dimension SEM includes an electron gun 201, a primary electron beam 303, a condenser lens 202, an objective lens 203, a deflector 204, an ExB deflector 205, a secondary electron detector 206, an alignment coil 208, an astigmatism correction coil 209 and an objective lens diaphragm 210. A sample chamber includes an x-y stage 101 on which a sample (a wafer) 100 is placed. A secondary electron signal detected by the secondary electron detector 206 is converted to a digital signal by an A/D converter 207 and inputted to an image processing unit 300. The image processing unit 300 including a CPU and an image memory is connected to a storing medium 301, a display device 302 and an I/F (interface) 320 for connecting the image processing unit 300 to a network 4000 illustrated in FIG. 8.

The primary electron beam 303 emitted from the electron gun 201 is converged by the condenser lens 202, focused on the wafer 100 placed on the stage 101 through the deflector 204, the ExB deflector 205 and the objective lens 203. The irradiation of electron beams causes the wafer 100 to emit the secondary electrons. The secondary electrons emitted from the sample wafer 100 are deflected by the ExB deflector 205 and detected by the secondary electron detector 206.

The two-dimensional scanning of the electron beams by the deflector 204 or the repetitive scanning of the electron beam in the X direction by the deflector 204 and the detection of electrons emitted from the sample in synchronization with the scanning of the electron beam in the Y direction (or the continuous movement of the wafer in the Y direction by the stage 101) provide a two-dimensional electron beam image (CD-SEM image). The secondary electron signal detected by the secondary electron detector 206 is converted to a digital signal (a CD-SEM sampling signal) 1100 by the A/D converter 207 and sent to the image processing unit 300.

The image processing unit 300 includes the image memory for temporarily storing the digital image 1100 and the CPU for calculating line profile and characteristic amount from an image on the image memory, and further includes the storing medium 301 for storing the detected image, the line profile or calculated pattern shape information. The display device 302 is connected to the image processing unit 300 and enables a required apparatus to be operated and detection results to be confirmed by a graphical user interface (GUI).

Figure 2:
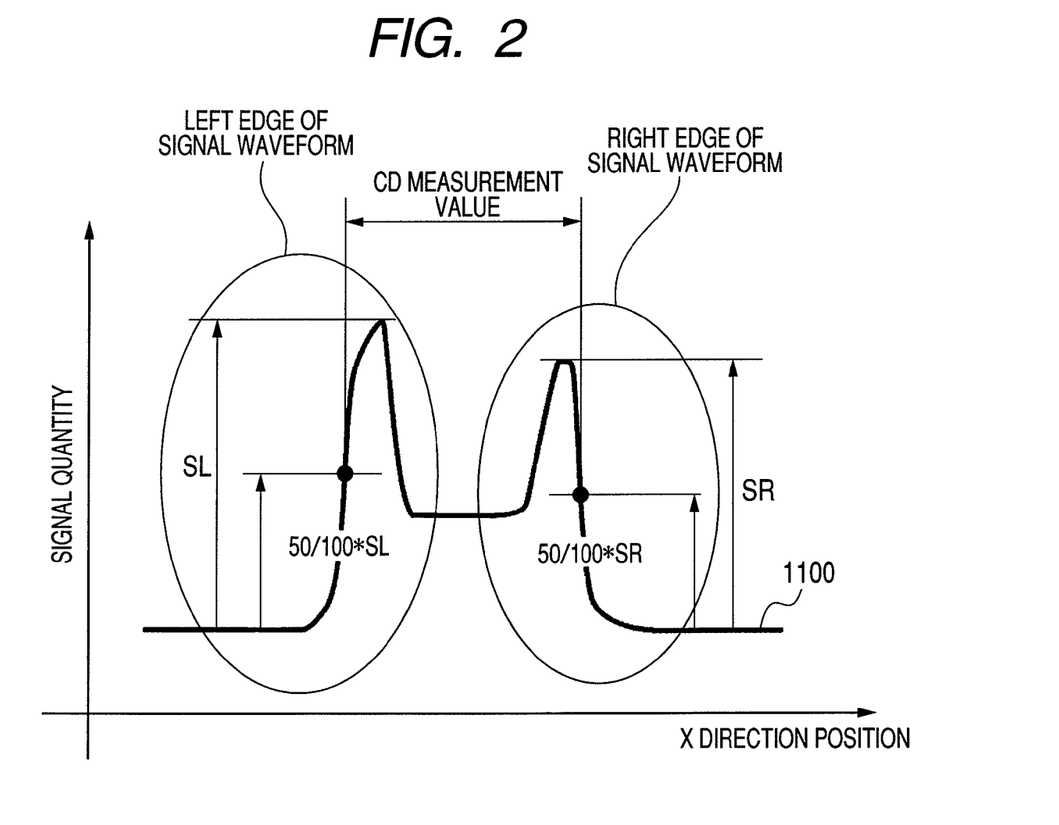
FIG. 2 is a diagram for steps for calculating CD measured data by a threshold method based on the CD-SEM image (a secondary electron image) observed in the CD-SEM tool.

A CD measurement procedure by a threshold method is described with reference to FIG. 2 based on the secondary electron signal amount obtained from the secondary electron signal (the CD-SEM sampling signal) 1100. Step 1) the image processing unit 300 determines the amount of a peak signal (the amount of the maximum signal) at each edge and the amount of signal at the substrate (the lower signal portions). Step 2) intersection points with each peak (SL or SR)× (threshold (%)/100) are taken to be left and right edge positions. The embodiment in FIG. 2 shows each peak (SL or SR)×threshold of 50%. Step 3) the distance between the left and the right edge position is taken to be a CD measurement result.

The cross section measurement using a cross section measuring tool formed of the STEM, TEM or SEM tool as cross-section observation, or the AFM is described below.

As previously described, the configuration of the STEM tool is described in, for example, JP-A 2003-287508. In addition, the configuration of the AFM tool is described in, for example, JP-A 2006-118867 as described above. Incidentally, the configuration of the cross section observation SEM tool and the TEM tool is omitted in description herein.

Figure 3A:
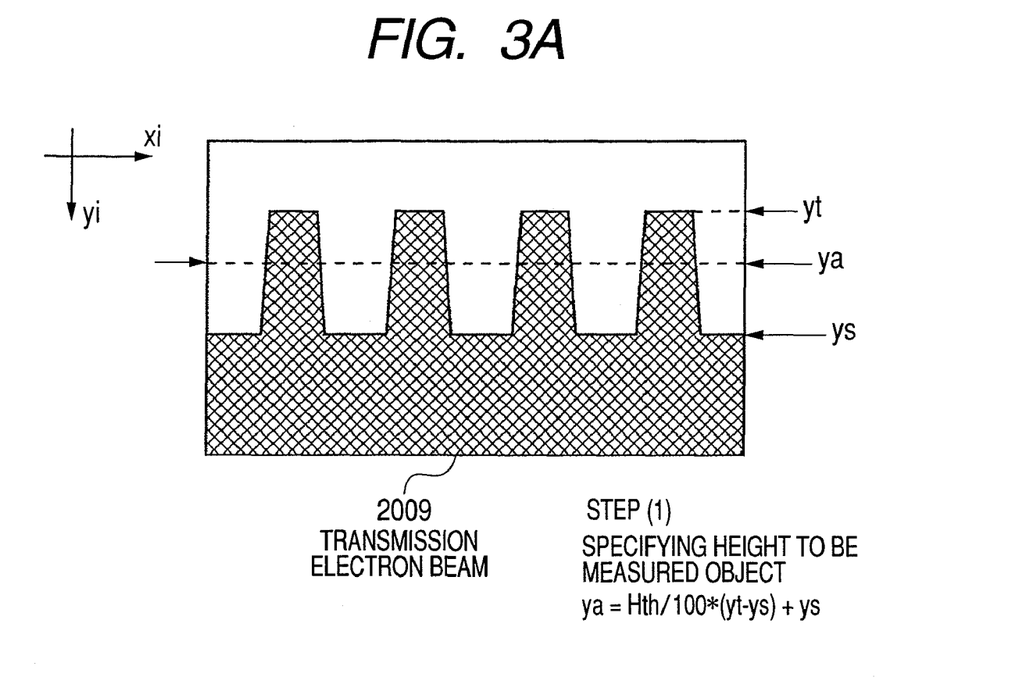
FIG. 3A is a schematic diagram of a transmission electron image (a cross section measurement image) observed in the STEM tool or the cross-section observation SEM tool being a cross section measuring tools.

A CD measurement procedure by the cross section measurement using a cross section measuring tool formed of the STEM tool or the cross section observation SEM tool is described with reference to FIGS. 3A and 3B. FIG. 3A illustrates a transmission electron beam image 2009 capable of measuring a cross section and obtained by the cross section measuring tool such as the STEM tool or the cross section observation SEM tool. At step (1), a pattern height "ya" to be measured is determined by the following equation (1):

$$ya = ((Hth(\%)/100) \times (yt - ys)) + ys \qquad (1)$$

where, "yt" is a height at the top of the cross section, and "ys" is a height at the bottom of the cross section. Height threshold "Hth" is a height desired to be calibrated with the CD-SEM at a pattern cross section, i.e., the height of a sample at which measurement is desired by the CD-SEM (which can not be designated by conventional CD-SEM measurement techniques).

Figure 3B:
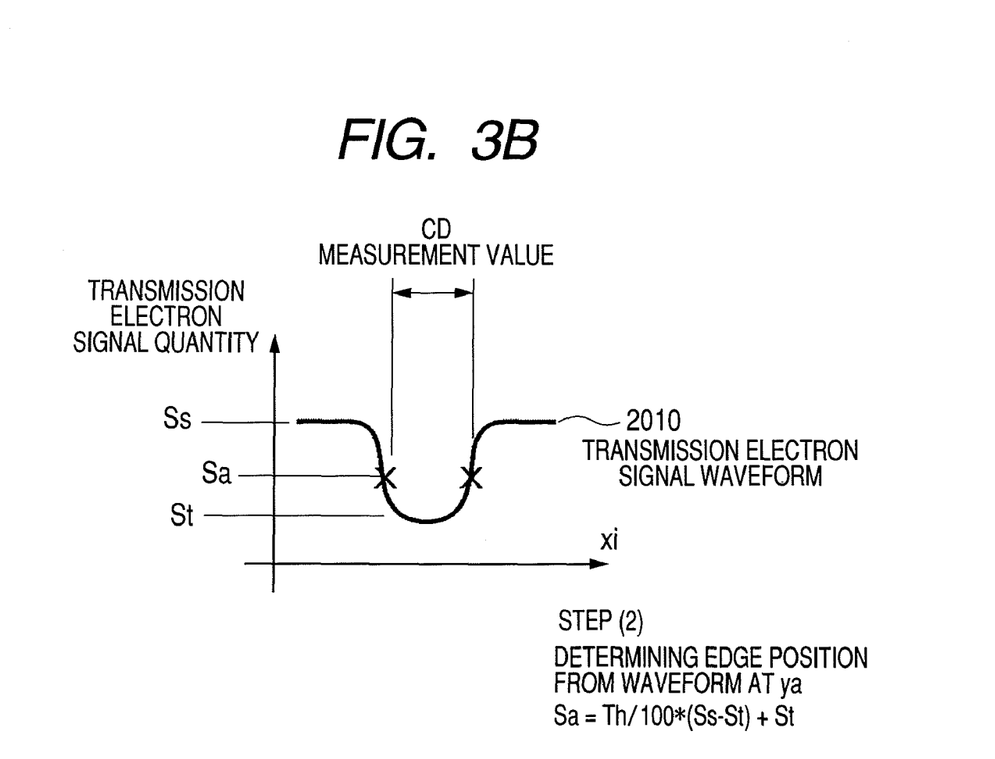
FIG. 3B is a chart illustrating a signal waveform of a beam scan at yi=ya in the transmission electron beam image of FIG. 3A.

FIG. 3B illustrates a transmission electron signal waveform 2010 detected based on the transmission electron beam image (the cross section measuring sampling image) 2009. At step (2), an edge position "Sa" is determined from the transmission electron signal waveform 2010 at the pattern height "ya" to be measured which is specified at the step (1) based on the following equation (2):

$$Sa = (Th/100 \times (Ss - St)) + St \qquad (2)$$

Incidentally, "Ss" denotes a transmission electron signal quantity obtained from the portion except for samples (which is generally filled with a protective film at the time of forming the sample) and "St" denotes a transmission electron signal quantity obtained from the pattern portion of the sample. The position at which the transmission electron signal quantity is equal to "Sa" is taken as the edge position of the pattern and the CD measured data can be obtained from the difference between the left and the right edge position. Incidentally, as is the case with the CD-SEM, the SEM tool provides a waveform whose pattern edge has a bright peak as illustrated in FIG. 2, so that the edge position and the CD measured data may be calculated with the same algorithm as used in the CD-SEM.

The above calculation provides the CD measured data between edge positions in which the height to be measured "ya" is determined.

Figure 4:
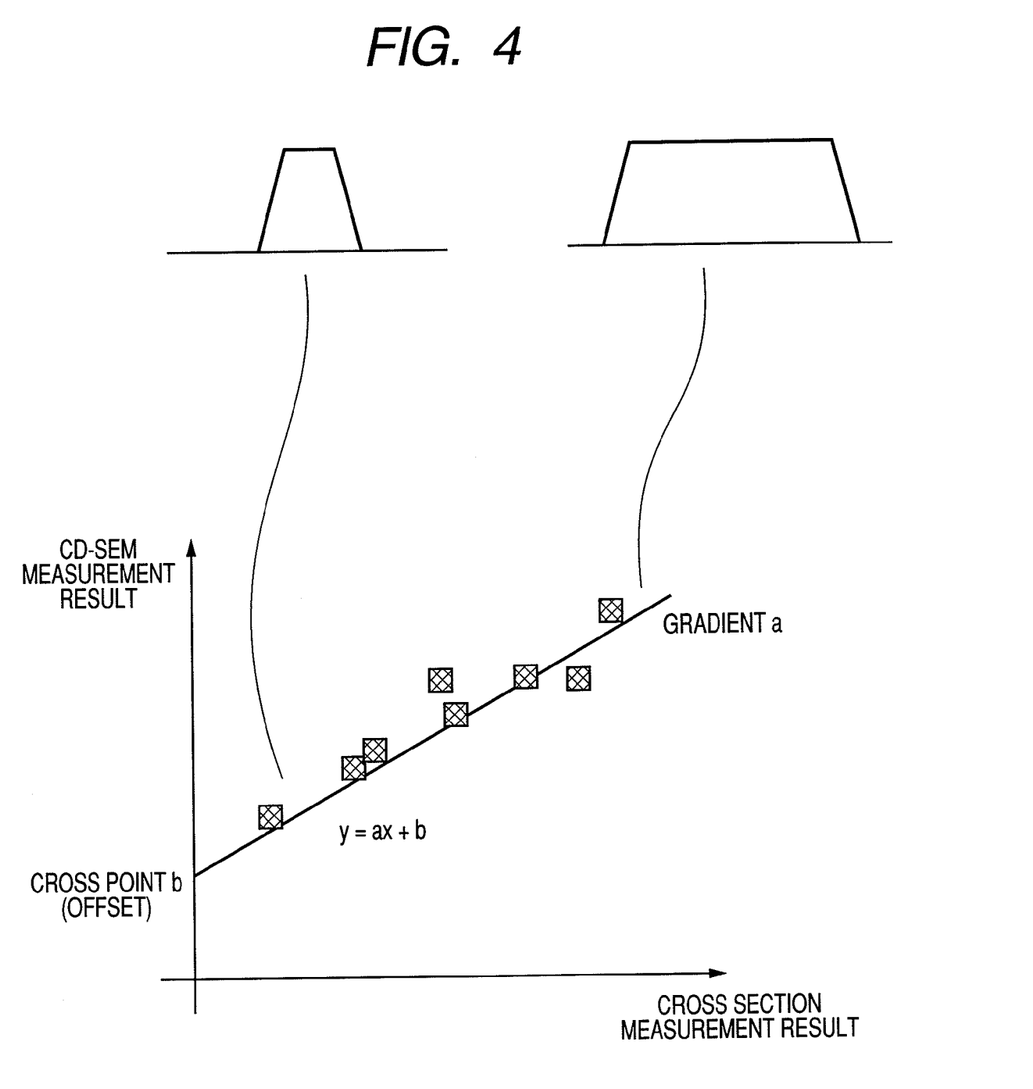
FIG. 4 is a chart illustrating a relationship between the measurement result by the CD-SEM tool and the cross section measurement result by the cross section measuring tool.
Figure 5A:
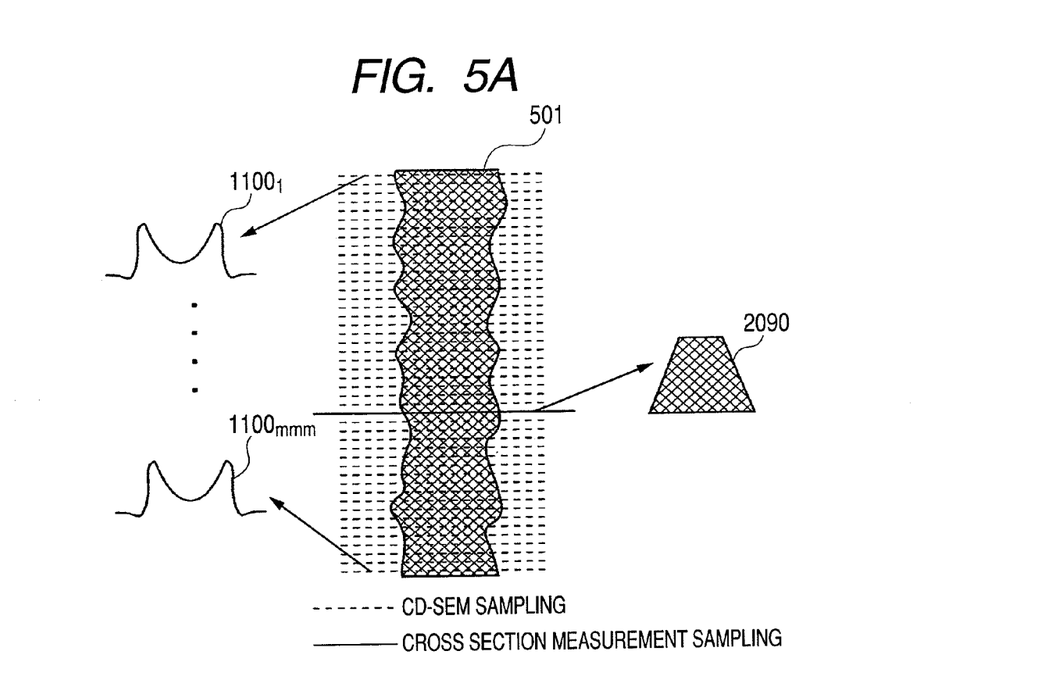
FIG. 5A is a chart illustrating a secondary electron image ($1100_1, \ldots 1100_{mmm}$) obtained when a line pattern is observed by the CD-SEM and an image obtained when the cross section of the line pattern is observed.

A method of determining the number of samplings in consideration of dispersion in pattern shape and/or size variation according to the present invention is described below with reference to FIG. 4. As illustrated in FIG. 4, when a calibration is performed between different measuring tools, i.e., between the CD-SEM tool 1000 and the cross section measuring tool (for example, the STEM tool, the cross section observation SEM tool or the AFM tool) 2000, plural samples different in dimension and a shape is measured to calibrate the measurement results from those of the plural samples. For example, if the measurement results of the both measuring tools are linear, as illustrated in FIG. 4, an equation (y=ax+b) may be determined which represents a relationship of the measurement results between two types of the measuring tools. Although JP-T 2006-510912 discloses the calibration method in consideration of each dispersion in measurement of the different measuring tools, dispersion in samples may be very large as compared with the measuring reproducibility of various measuring tools in an existing semiconductor measurement, so that dispersion in samples needs considering as well as the accuracy and precision of the measuring tool to realize a high accurate calibration. At the time of performing a calibration between different measuring tools, the measuring tools which are compared desirably measure exactly the same place; however, it is actually difficult to measure exactly the same place, because each measuring tool has limitations on the selection of measuring place different sampling characteristics depending on the measuring principle of the measuring tool. FIG. 5 is an embodiment illustrating a difference in such a sampling and an influence thereof. FIG. 5A shows a difference in a sampling position with respect to the secondary electron beam image (the CD-SEM image) of the pattern with line edge/width roughness 501 observed by the CD-SEM tool 1000.

When a cross section measurement is performed by the cross section measuring tool 2000 such as, for example, the STEM tool or the cross section observation SEM tool, a sample needs to be subjected to a focus ion beam (FIB) process or cleaving process to form the sample for cross section measurement and it is difficult to continuously measure adjacent places, so that sampling of cross section measurement is performed at only one point of a cross section shape 2090 indicated by a solid line, for example, in FIG. 5A. On the other hand, the CD-SEM measuring tool 1000 can comparatively densely measure the pattern with line edge/width roughness 501 as indicated by chain lines and the secondary electron signal waveforms $1100_1$ to $1100_{mmm}$ obtained by each beam scan described with chain line. FIG. 5 describes how dispersion in sample dimension due to the pattern with line edge/width roughness 501 illustrated in FIG. 5A influences the calibration result in this case.

Figure 5B:
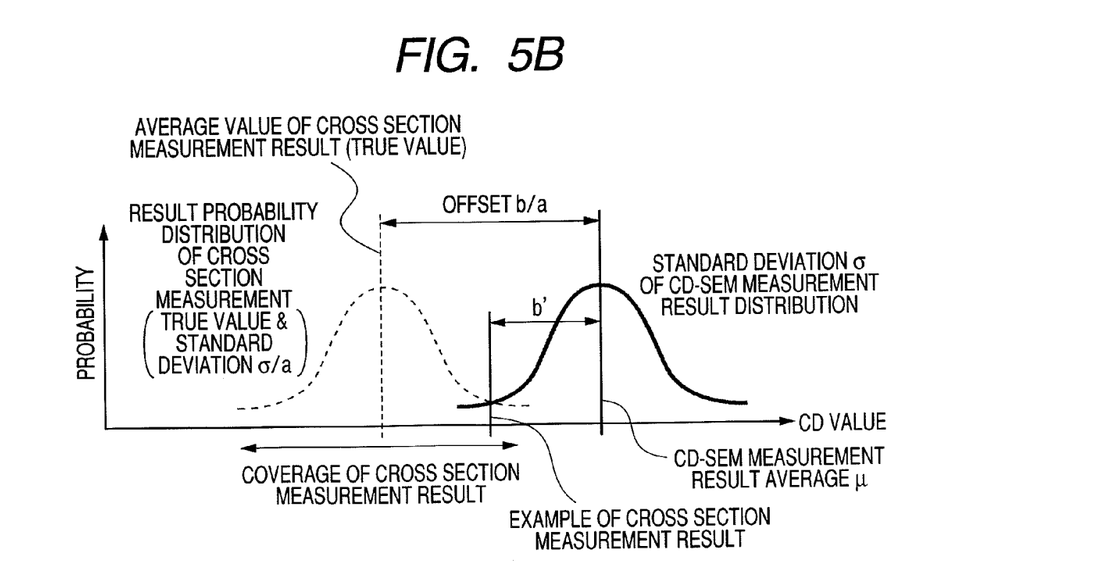
FIG. 5B is a chart illustrating a relationship between the distribution of results (average value µ and standard deviation σ) measured by CD-SEM and probability distribution (average value (true value) and standard deviation σ/a) of cross section measurement result if a completely identical sampling is presumed to be possible between the CD-SEM tool and the cross section measuring tool.

As illustrated in FIG. 5A, if a sample with roughness is densely measured (in general, several hundred points can be measured from one image) as indicated by chain lines with the CD-SEM tool to detect the secondary electron signal waveforms $1100_1$ to $1100_{mmm}$, the measurement result of the CD-SEM has a distribution according to dispersion in CD (a standard deviation σ) indicated by a solid line as illustrated in FIG. 5B. On the other hand, if the cross section measurement also enables exactly the same sampling, the cross section measurement result also follows the distribution of substantially the same dispersion (the standard deviation σ) as the CD-SEM measurement result. The distribution and average value (true value) of cross section measurement indicated by chain lines illustrated in FIG. 5B presumes that exactly the same sampling as the CD-SEM measurement is enabled. If the two different measuring tools maintain the relationship illustrated in FIG. 4, dispersion in dimension (standard deviation) σ' of the cross section measurement is equal to 1/a of dispersion in dimension (standard deviation) σ being the CD-SEM measurement result and the offset of the cross section measurement with respect to the CD-SEM measurement is b/a, which is a value actually impossible to measure. If the pitches of different measuring tools have been individually calibrated by a known sample, a=1. As illustrated in FIG. 5A, if it is enabled to perform the cross section measurement of only one point, the coverage of cross section measurement result may vary by the same extent as a sample dispersion σ/a. In this case, the estimate of offset b/a produces a calibration error of only the magnitude of sample dispersion with respect to the true value, as shown in b', for example.

On the other hand, if the cross section measurement is performed at plural points, the measuring points by the CD-SEM are presumed to cover the entire range of the cross section measurement in the present embodiment. An error resulted from a measuring position displacement between different tools in calibration can be considered as same as how to estimate average dimension of population with limited sampling when the area which is measured by CD-SEM covers population of measurement target.

This enables the estimation accuracy of average dimension of population to be estimated from dispersion in population and the number of samplings of the cross section measurement if dispersion in dimension measured by the CD-SEM is random and the cross section measurement points are extracted at random. For example, as illustrated in FIG. 6, the case is considered where the measurement range (indicated by the frames of the chain lines) of the CD-SEM on the sample and the number of cross section measurement (indicated by the solid line) corresponding thereto are increased.

Figure 6A:
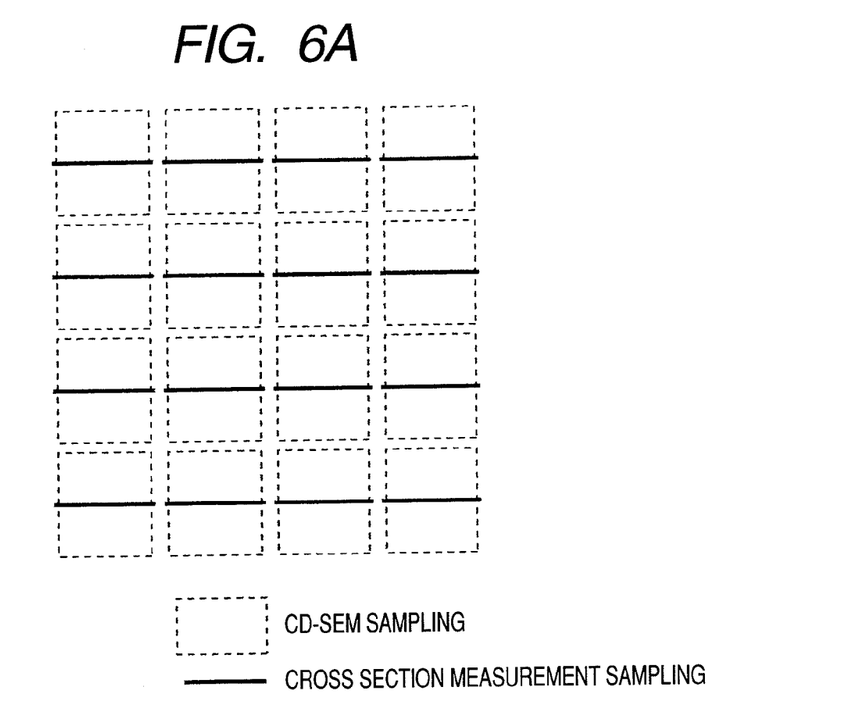
FIG. 6A is a chart illustrating a sampling position on a sample, plural square areas indicated by a dotted line shows the one sampled by the CD-SEM tool and plural thick solid lines shows positions sampled by the cross section measuring tool.
Figure 6B:
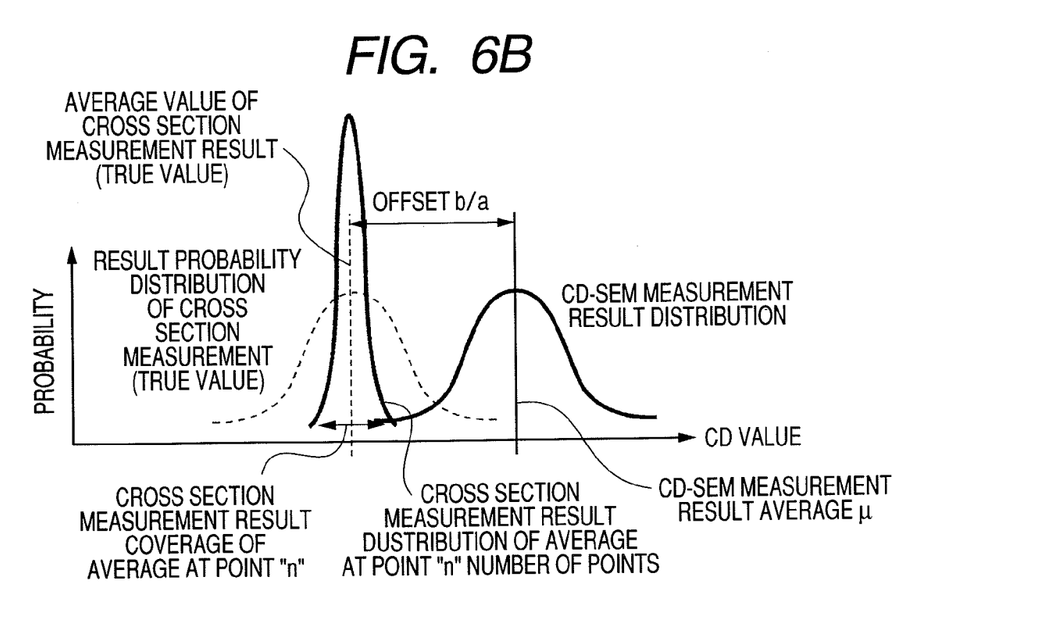
FIG. 6B is a chart illustrating a relationship between the distribution of results (average value µ and standard deviation σ) measured by the CD-SEM tool and the distribution of an average value (average value (true value) and coverage of average value) of results measured by a cross section measuring tool when the number of measurement points by the cross section measuring tool is taken as "n"

In FIG. 6, dispersion of linewidths (line width roughness) in sample is continuously varied, but its distribution of population is normally random. For this reason, as illustrated in FIG. 6A, if the cross section measurement of the measurement range indicated by the frames of the chain lines is performed at a constant interval as indicated by the solid line, the sampling of the cross section measurement is random. Although FIG. 5 shows the case where the cross section measurement is performed only at one point, the cross section measurement is thus performed at plural points as illustrated in FIG. 6, narrowing the range of probability distribution of the value covered by average value of the cross section measurement according to the number of the cross section measurement points "n". N samples from the normal population following the average value of the cross section measurement $\mu'=\mu-(b/a)$ and the standard deviation of the cross section measurement $\sigma'=\sigma/a$ are taken as X1, X2, . . . , Xn. Where, $\sigma$ is a standard deviation representing dispersion in dimension measured by the CD-SEM.

Then, if "t" is put on the following equation (3), "t" follows the t distribution of a degree of freedom n−1.

$$t=(X\text{mean}-\mu')/(\sigma'/\text{sqrt}(n)) \quad (3)$$

Figure 7:
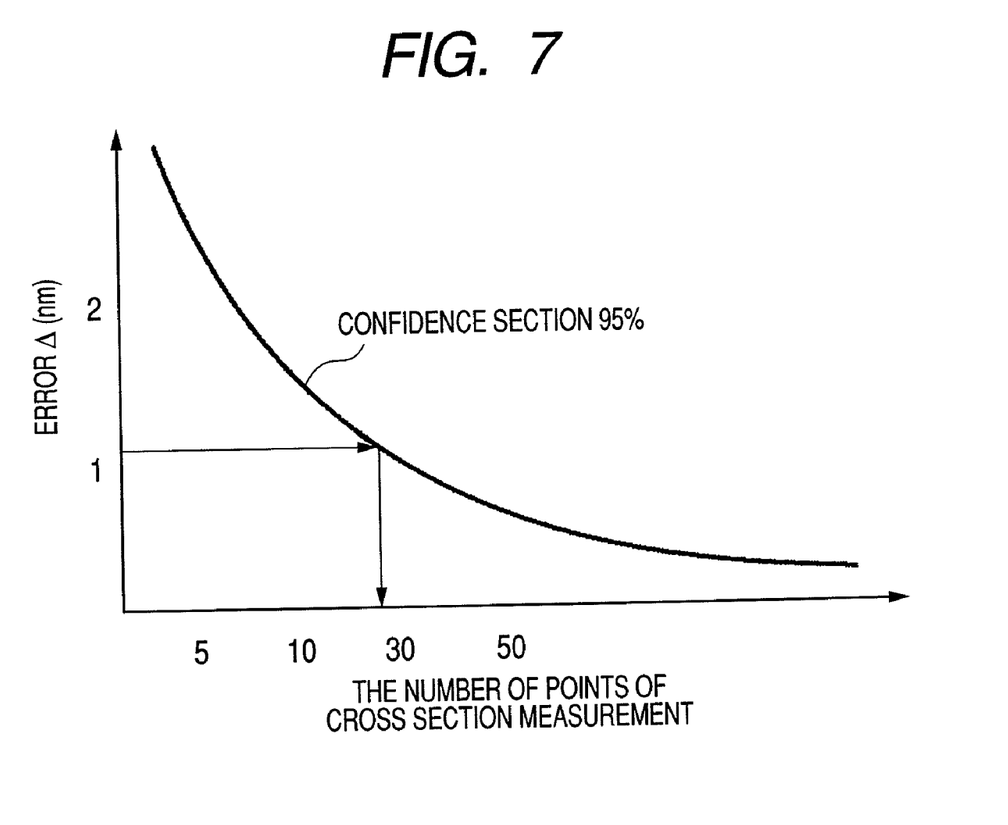
FIG. 7 is a chart for calculating the number of cross section measurement points "n" required for calibration by specifying allowable error Δ(nm) and a confidence interval based on the standard deviation σ obtained by statistically processing degree of line width roughness measured in advance by the CD-SEM tool.

Suppose each of different measuring tools has been calibrated to some extent, "a" is normally equal to approximately 1, so that $\sigma'$ (the standard deviation of the cross section measurement) can be taken as $\sigma$ (the standard deviation of the CD-SEM measurement). At this point, a range that can be covered by an estimate of the average value (or, a true value) $\mu'$ of the cross section measurement can be estimated using a confidence section. The range that can be covered by the average value of n samples is represented by the following equation (4):

$$\mu'-t\_\alpha/2\times\sigma/\text{sqrt}(n)<X\text{mean}<\mu'+t\_\alpha/2\times\sigma/\text{sqrt}(n) \quad (4)$$

where, $t\_\alpha/2\times\sigma/\text{sqrt}(n)$ is a value of "t" (degree of freedom n−1) at which an external probability is equal to $(\alpha/2)$ % and the maximum value of estimate error of the average value (a true value) $\mu'$ of the cross section measurement is $\pm t\_\alpha/2\times\sigma/\text{sqrt}(n)$. In general, a often uses 5% (1−α=95% confidence section). The maximum value of $\pm t\_\alpha/2\times\sigma/\text{sqrt}(n)$ corresponds to a matching error (accuracy required for calibration (error $\Delta(nm)$)) of the average value in the case where the average of population and the number of samplings "n" are extracted from the population at random between measurement data set in a pattern formed to be have the same dimension and shape like the line pattern illustrated in FIG. 6A. If dispersion in the population (the standard deviation $\sigma$) and the number of sampling data "n" are given, the matching error can be estimated, or, conversely, the allowance of the matching error is given, the number of samples "n" required for realizing the matching by the allowable error can be calculated. That is to say, evaluating dispersion in dimension (the standard deviation $\sigma$) of sample by the CD-SEM in advance enables the number of the cross section measurement points "n" to be determined from these results (a relation of the above equation (4) and particularly a relation from which a confidence section of 95% can be obtained) to realize an accuracy (the error $\Delta(nm)$) required for calibration as illustrated in FIG. 7. It is needless to say that the confidence section is varied also to vary the number of the cross section measurement points. Thus, the increase of the number of samplings if required enables an accurate calibration between different measuring tools in consideration of dispersion in samples. Incidentally, as illustrated in FIG. 4, if a calibration is performed by an approximate straight line using plural data sets different in dimension and shape and the estimated accuracy $\Delta'$ by the approximate straight line is the number of data sets M, $\Delta'=\Delta/\text{sqrt}(M-1)$. If the allowance of estimation error of the straight line is set, the estimated accuracy $\Delta'$ may be used instead of the error $\Delta$.

Figure 8:
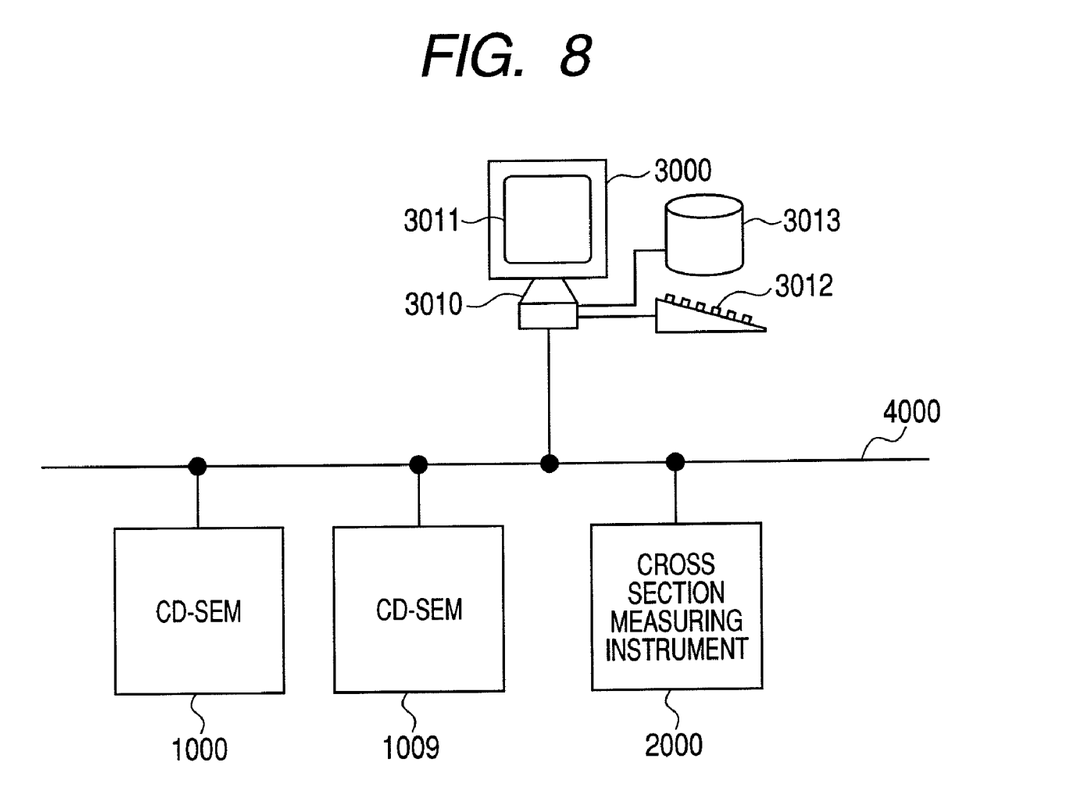
FIG. 8 is a schematic diagram illustrating one embodiment of a calibration system between different measuring tools.

The configuration of the calibration system between different measuring tools according to the present invention is described with reference to FIG. 8. That is to say, a calibration unit 3000 for performing a calibration between different measuring tools according to the present invention is formed of one or more CD-SEM tools (e.g. 1000 and/or 1009) and a specific kind of, or plural kinds of, cross section measuring tools (formed of, for example, the STEM tool, the cross section observation SEM tool, the AFM tool or the TEM tool) through a network 4000. The calibration unit 3000 includes a calculation unit 3010 with a computer, a display unit 3011 with a GUI displaying average value and roughness (dispersion in dimension (the standard deviation a)) measured by one or more CD-SEM tools, average value and its standard deviation measured at a point "n" determined by the cross section measuring tool and calibration value, an input unit 3012 for inputting a confidence section (for example, 95%) and accuracy (error $\Delta(nm)$) required for calibration using the display unit 3011 and a storing unit 3013 for storing various conditions including a recipe and detected images. It is needless to say that the calibration unit 3000 may be provided on, for example, an image processing unit 300 in one or more CD-SEM tools (e.g., 1000 and/or 1009) or on an image processing unit or a calculation unit in the cross section measuring tool 2000. In this case, one or more CD-SEM tools (e.g. 1000 and/or 1009) may be directly connected to the cross section measuring tool 2000 through the network 4000.

Figure 9:
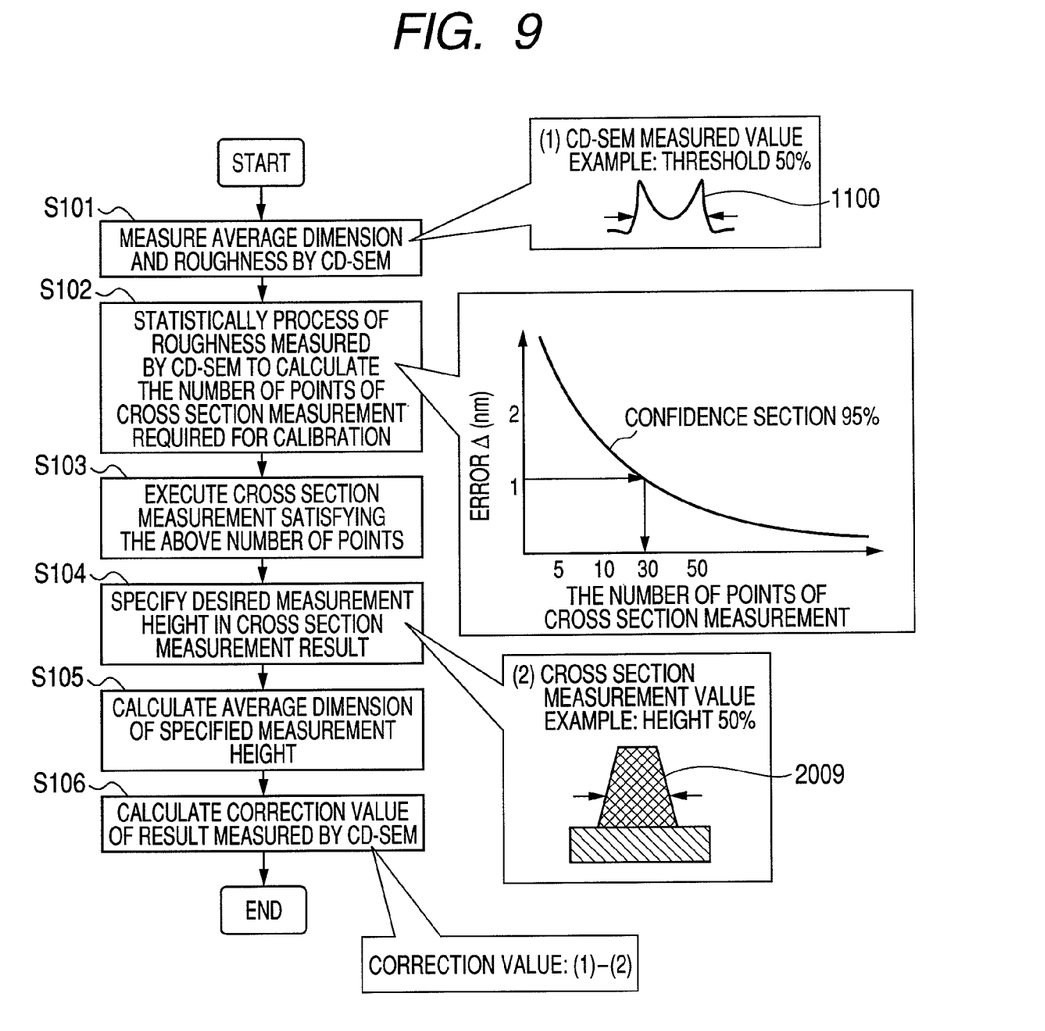
FIG. 9 is a flow chart illustrating one embodiment of a process flow of a calibration method between different measuring tools.

One embodiment of the calibration method between different measuring tools according to the present invention is described below with reference to FIG. 9. The CD-SEM tool 1000 densely measures (normally, several hundred points can be measured on one image) each measurement range on a sample with roughness indicated by a chain-line frame as illustrated in FIG. 6A, specifically, as indicated by the chain lines in FIG. 5A to detect the secondary electron signal $1100_1$ to $1100_{mmm}$, calculates a distance (CD measured data) between the left and the right edge position, obtained in the image processing unit 300 by the threshold method (a threshold value of 50% for each peak (SL or SR)) as illustrated in, for example, FIG. 2, based on the secondary electron signal quantity obtained from the detected secondary electron signal (the CD-SEM sampling signal) $1100_1$ to $1100_{mmm}$, calculates an average value (average dimension) $\mu$ of the calculated distance (CD measured data) and dispersion in dimension (standard deviation σ) due to roughness as CD measurement result based on a statistical processing, and stores them in, for example, a storing medium 301 illustrated in FIG. 1 or a storing unit 3013 illustrated in FIG. 8 (S101). Then, for example, the calculation unit 3010 (which forms, for example, the cross section measurement points calculating unit and the correction value calculating unit) in the calibration unit 3000 calculates the number of the cross section measurement points "n" required for calibration in accordance with the above equation (4), i.e., FIG. 7, based on the roughness measurement result (particularly, dispersion in dimension (the standard deviation σ due to roughness) which is subjected to statistical processing at the step S101 and stored in the storing medium 301 or the storing unit 3013 and the confidence section (for example, 95%) or the accuracy (the error Δ(nm)) required for calibration inputted using the input unit 3012, and transmits the number of the cross section measurement points "n" to the cross section measuring tool 2000 through the network 4000 (S102).

The cross section measuring tool (for example, the STEM tool, the cross section observation SEM tool or the AFM tool) 2000 receiving the number of the cross section measurement points "n" required for calibration performs the cross section measurement of the cross section measurement sampling (solid line) satisfying the number of the cross section measurement points "n", illustrated in, for example, FIG. 6 to obtain the cross section shape measurement result 2009 illustrated in, for example, FIG. 5A and temporarily stores the result in a storing medium in the cross section measuring tool 2000 (S103). Incidentally, if the cross section measuring tool is the STEM tool or the cross section observation SEM tool, a sample used for the cross section measurement satisfying the cross section measurement points "n" needs forming using a focus ion beam (FIB) processing apparatus. A desired height to be measured "ya" (for example, 50%) illustrated in FIG. 3A is specified using, for example, the transmission electron beam image 2009 being the cross section shape measurement result displayed on the graphic user interface (GUI) of a display unit (not shown) provided on the cross section measuring tool 2000 (S104). An image processing unit (a calculation unit, not shown) provided on the cross section measuring tool 2000 determines the edge position at the desired measuring height "ya" specified based on, for example, the transmission electron signal waveforms $2010_1$ to $2010_n$ detected from the cross section measurement sample satisfying the number of the cross section measurement points "n" as illustrated in FIG. 3B, calculates the CD measured data being the distance between the determined edge positions, calculates the average value μ' of the calculated CD measured data, stores the average value μ' in the storing unit (not shown) in the cross section measuring tool 2000, transmits the average value μ' through the network 4000 and stores it in the storing unit 3013 of the calibration unit 3000 (S105).

As a result, the calculation unit 3010 in the calibration unit 3000 permits a matching error (accuracy required for calibration (error Δ(nm)) (in a range (±t_α/2×σ/sqrt(n) that can be covered by the average value μ' at a point "n" being the cross section measurement result), calculates a calibration correction value (b/a, or the correction value of measurement result by the CD-SEM tool) being the difference between the average value μ of the CD measured data stored in the storing medium 301 of the CD-SEM tool 1000 or the storing unit 3013 and measured by the CD-SEM tool 1000 and the average value μ' of the CD measured data of the cross section shape at the number of cross section measurement points "n" measured by the cross section measuring tool 2000 and stored in the storing medium (not shown) of the cross section measuring tool 2000 or the storing unit 3013 and displays the calibration correction value on the display unit 3011, the display unit 302 of the CD-SEM tool 1000 or the display unit (not shown) of the cross section measuring tool 2000 (S106).

When the calibration correction value (b/a, or the correction value of measurement result by the CD-SEM tool) is displayed, the average value μ and dispersion in dimension (the standard deviation σ) of the CD measured data measured by the CD-SEM tool 1000 and the average value μ' of the CD measured data of cross section shape at the number of the cross section measurement points "n" measured by the cross section measuring tool 2000 may be displayed. Furthermore, dispersion in dimension (the standard deviation σ) of the CD measured data of cross section shape at the number of the cross section measurement points "n" measured by the cross section measuring tool 2000 may be displayed. Still furthermore, any one or more or all of the confidence section (1−α), allowable matching error (accuracy required for calibration (error Δ(nm)), the number of the cross section measurement points "n", a range (±t_α/2×σ/sqrt(n)) that can be covered by the average value μ' at a point "n" being the cross section measurement result may be displayed.

Figure 10:
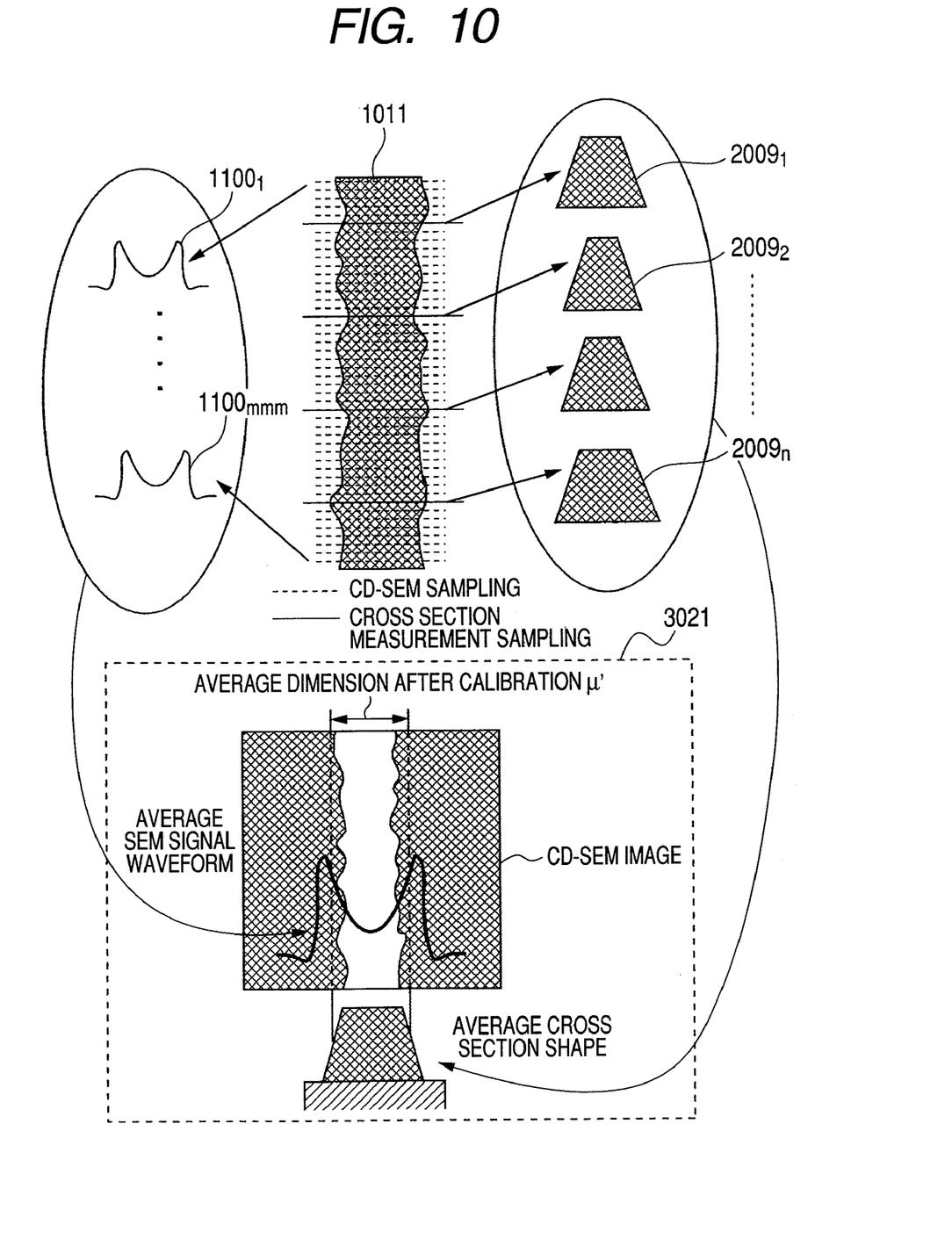
FIG. 10 is a chart illustrating a GUI screen 3021 being a result of calibration method between different measuring tools according to the present invention, CD-SEM sampling position on the line patterns 1011 corresponding to the average SEM signal waveform displayed on the GUI screen, cross section measurement sampling position on the line pattern 1011 corresponding to the signal waveforms $1100_1 \ldots 1100_{mmm}$ and the average cross section shape, and cross section observation image $2009_1 \ldots 2009_n$ in each sampling position.

Thus, the calibration correction value (b/a, or the correction value of measurement result by the CD-SEM tool) for the true value is calculated, so that the display unit 302 of the CD-SEM tool 1000, as is the case with FIG. 5A, displays the secondary electron signal waveforms $1100_1$ to $1100_{mmm}$ obtained by subjecting the secondary electron beam image (CD-SEM image) of the roughness pattern 1011 observed by the CD-SEM tool to the CD-SEM sampling as indicated by chain lines and the cross section shape (transmission electron beam image) $2009_1$ to $2009_n$ obtained by executing the cross section measurement sampling satisfying the number of the cross section measurement points "n" as indicated by the solid line as GUI 3021 as the result of calibration, as illustrated in FIG. 10, superimposes the average CD-SEM signal waveform and the average dimension μ' after calibration on the CD-SEM image to enable displaying the average cross section shape obtained by the cross section measurement sampling at this moment.

Since the calibration correction value (b/a, or correction value of measurement result by the CD-SEM tool) for the true value is calculated, if samples with various dimensions can be prepared as objects to be measured, the gain (a) and the offset (b) of the CD measurement result (y) by the CD-SEM tool 1000 can be corrected as illustrated in FIG. 4.

Since the calibration correction value (b/a, or correction value of measurement result by the CD-SEM tool) for the true value is calculated, image processing conditions for outputting a desired dimension can be specified instead of the offset in the image processing unit 300 of the CD-SEM tool 1000.

Figure 11:
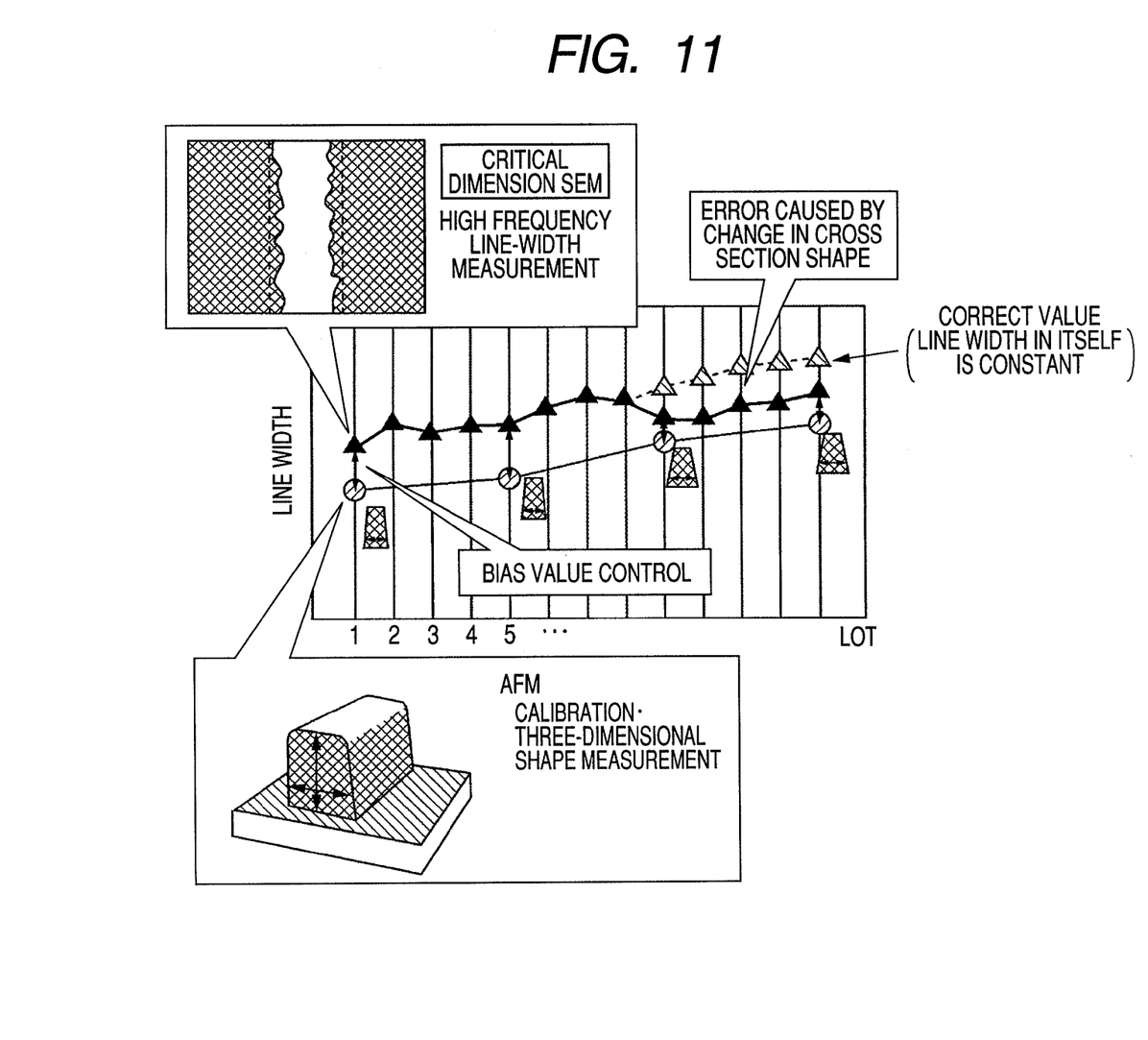
FIG. 11 is a chart illustrating a GUI screen for controlling bias value using a calibration method between different measuring tools.

Displaying the average value of linewidth measured data (CD measured data) of the CD-SEM tool 1000, for example, in units of lot (high frequency) as illustrated in FIG. 11 and the average value of the CD measured data of the cross section shape measurement (three dimensional shape measurement) at the number of the cross section measurement points "n" required for a periodical calibration by the cross section measuring tool 2000 (for example, the AFM tool) as GUI on the display unit 3011 of the calibration unit 3000, the display unit 302 of the CD-SEM tool 1000 or a display unit (not shown) of the cross section measuring tool 2000 enables the observation that the average value of the CD measured data by the CD-SEM tool 1000 does not change so much and a change is observed in a calibration correction value (b/a), as a result a line width is unchanged, but a bias error resulting from change in the cross section shape is caused, that is to say, enables the bias value to be controlled. It is needless to say that change in the cross section shape also changes the calibration correction value (b/a).

Figure 12:
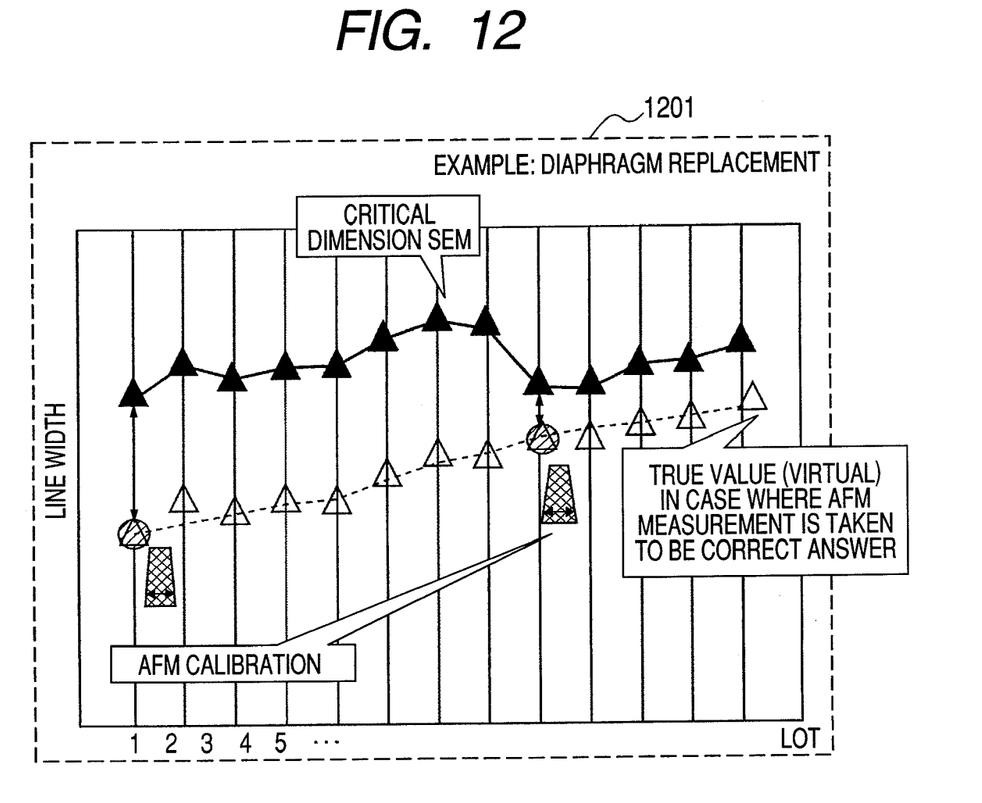
FIG. 12 is a chart illustrating a GUI screen 1201 which displays change in a measuring condition of the CD-SEM tool using a calibration method between different measuring tools.

Displaying the average value of linewidth measured data (CD measured data) of the CD-SEM tool 1000, for example, in units of lot (high frequency) as illustrated in FIG. 12 and the average value of the CD measured data of the cross section shape measurement (three dimensional shape measurement) at the number of the cross section measurement points "n" required for a periodical calibration by the cross section measuring tool 2000 (for example, the AFM tool) as GUI 1201 on the display unit 3011 of the calibration unit 3000, the display unit 302 of the CD-SEM tool 1000 or a display unit (not shown) of the cross section measuring tool 2000 enables the observation that a change is observed in the average value of the CD measured data measured by the CD-SEM tool 1000 and a calibration correction value (b/a), as a result, a change is caused in measuring conditions (for example, replacement of objective lens diaphragm 210) in the CD-SEM tool 1000. It is needless to say that change in the measuring conditions (shooting condition and image processing condition) also changes the calibration correction value (b/a).

The invention may be embodied in other forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of calibrating measured data between different measuring tools, comprising the steps of:
    measuring a plurality of measurements of a Critical-Dimension (CD) of an object, and roughness data of the object, by using a Critical-Dimension Scanning Electron Microscopy (CD-SEM) tool at different locations on the object;
    calculating an average of, and a dispersion of, the CD values measured by the CD-SEM;
    calculating a number of cross section measurement points of the object required for calibration;
    measuring the object at the calculated number of cross section measurement points of the object, by using a cross section measuring tool at the calculated number of cross section measurement points of the object;
    calculating an average CD value at a specified desired measurement height, based on the obtained cross section measurements of the object; and
    calculating a calibration correction value, that is a function of a difference between the average CD value as measured by the CD-SEM measurement, and the average CD value at a specified desired measurement height of the object as measured by the cross section measuring tool.

2. The method of calibrating measured data between different measuring tools according to claim 1,
    wherein the calculation of the number of cross section measurement points is based on a standard deviation representing a dispersion of the cross section measurements;
    wherein the standard deviation is obtained by statistically processing roughness data measured by CD-SEM measurement; and
    wherein a minimal accuracy required for a calibration to be considered allowable is specified in advance.

3. The method of calibrating measured data between different measuring tools according to claim 2,
    wherein the number of cross section measurement points is calculated based on a confidence section specified in advance.

4. The method of calibrating measured data between different measuring tools according to claim 1, further comprising:
    displaying the calculated calibration correction value.

5. The method of calibrating measured data between different measuring tools according to claim 1, further comprising:
    displaying the calculated calibration correction value, the average CD value of the object as measured by CD-SEM measurement, and the average measured cross section height of the object as measured by the cross section measuring tool.

6. The method of calibrating measured data between different measuring tools according to claim 1, further comprising:
    displaying the calculated calibration correction value, the average of CD values measured by the CD-SEM, a standard deviation of CD values measured by the CD-SEM, and the average CD value at a specified desired measurement height of the object as measured by the cross section measuring tool.

7. The method of calibrating measured data between different measuring tools according to claim 1, further comprising:
    displaying the average CD value, and the average CD value corrected by the calculated calibration correction value.

8. The method of calibrating measured data between different measuring tools according to claim 1, further comprising:
    displaying secondary electron signal waveforms measured at the CD-SEM measurement, and displaying cross section shape waveforms measured at a cross section measurement.

9. The method of calibrating measured data between different measuring tools according to claim 1,
    wherein the Critical-Dimension (CD) measurements and the cross section measurements are orthogonal to one another.

10. The method of calibrating measured data between different measuring tools according to claim 1,
    wherein the cross section measurements are performed by at least one of a Scanning Transmission Electronic Microscope (STEM), a Transmission Electronic Microscope (TEM), and an Atomic Force Microscope (AFM), and a cross-section observation Scanning Electron Microscopy (SEM) tool.

11. A method of calibrating measured data between different measuring tools comprising the steps of:
    calculating a number of cross section measurement points at which an object is to be measured with a cross section measuring tool, by statistically processing roughness data of the object as measured by a CD-SEM tool;
    sequentially measuring a plurality of objects, by using the CD-SEM tool to measure a change in the average CD value thereof;
    measuring a cross section of each of the plurality of objects, by using the cross section measuring tool at the calculated number of cross section measurement points, in order to calculate a change in the average CD value at a specified desired measurement height between two or more objects; and controlling a bias based on the calculated change in the average CD value of the measured objects, and change in the average CD value at a specified desired measurement height of the object.

12. The method of calibrating measured data between different measuring tools according to claim 11,
wherein at the step of controlling a bias, a calibration correction value is calculated as a difference between the average CD value of the same object measured at the step of the CD-SEM measurement, and average CD value at a specified desired measurement height is calculated at the step of measuring the cross section.

13. The method of calibrating measured data between different measuring tools according to claim 11,
wherein the Critical-Dimension (CD) measurements and the cross section measurements are orthogonal to one another.

14. The method of calibrating measured data between different measuring tools according to claim 11,
wherein the cross section measurements are performed by at least one of a Scanning Transmission Electronic Microscope (STEM), a Transmission Electronic Microscope (TEM), and an Atomic Force Microscope (AFM), and a cross-section observation Scanning Electron Microscopy (SEM) tool.

15. A system for calibrating measured data between different measuring tools comprising:
a CD-SEM tool, that measures average CD values, and roughness data of an object;
a cross section measurement points calculating unit, that statistically processes the roughness data measured by the CD-SEM tool to calculate a number of cross section measurement points of the object required for calibration;
a cross section measuring tool, that measures the number of cross section measurement points of the object calculated by the cross section measurement points calculating unit, and calculates average CD value at a specified desired measurement height specified in a designated cross section measurement result; and
a calibration correction value calculating unit, that calculates a calibration correction value that is a function of a difference between the average CD value of the object, as measured by the CD-SEM tool, and average CD value at a specified desired measurement height of the object, average CD value at a specified desired measurement height of the object being calculated by the cross section measuring tool.

16. The system for calibrating measured data between different measuring tools according to claim 15,
wherein in the cross section measurement points calculating unit, the number of cross section measurement points is calculated based on a standard deviation representing a dispersion of the cross section measurement points;
wherein the standard deviation is obtained by statistically processing roughness data measured at least by the CD-SEM tool; and
wherein a minimal accuracy required for a calibration considered to be allowable is to be specified in advance.

17. The system for calibrating measured data between different measuring tools according to claim 15, further comprising:
a display for displaying the calibration correction value calculated by the calibration correction value calculating unit.

18. The system for calibrating measured data between different measuring tools according to claim 15, further comprising:
a display for displaying the calibration correction value calculated by the calibration correction value calculating unit, the average CD value of the object, and a standard deviation representing CD dispersion in measurement of the object, the average CD value and the standard deviation being measured by the CD-SEM tool, and average CD value at a specified desired measurement height of the object being calculated by the cross section measuring tool.

19. The system for calibrating measured data between different measuring tools according to claim 15, further comprising:
a display that displays the average CD value of the object, as measured by the CD-SEM tool, and as corrected by the calibration correction value calculated by the calibration correction value calculating unit with respect to the CD-SEM image of the object as measured by the CD-SEM tool.

20. The system for calibrating measured data between different measuring tools according to claim 15,
wherein the Critical-Dimension (CD) measurements and the cross section measurements are orthogonal to one another.

21. The system for calibrating measured data between different measuring tools according to claim 15,
wherein the cross section measurements are performed by at least one of a Scanning Transmission Electronic Microscope (STEM), a Transmission Electronic Microscope (TEM), and an Atomic Force Microscope (AFM), and a cross-section observation Scanning Electron Microscopy (SEM) tool.

* * * * *